US010777245B2

(12) United States Patent
Redaelli

(10) Patent No.: US 10,777,245 B2
(45) Date of Patent: Sep. 15, 2020

(54) VERTICAL DECODERS

(71) Applicant: Micron Technology, Inc., Boise, ID (US)

(72) Inventor: Andrea Redaelli, Casatenovo (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/253,485

(22) Filed: Jan. 22, 2019

(65) Prior Publication Data
US 2020/0234747 A1    Jul. 23, 2020

(51) Int. Cl.
  *G11C 8/00*    (2006.01)
  *G11C 8/10*    (2006.01)
  *G11C 5/06*    (2006.01)
  *G11C 5/02*    (2006.01)

(52) U.S. Cl.
  CPC .................. *G11C 8/10* (2013.01); *G11C 5/02* (2013.01); *G11C 5/063* (2013.01)

(58) Field of Classification Search
  CPC .............. G11C 8/10; G11C 5/02; G11C 5/063
  See application file for complete search history.

(56) References Cited

U.S. PATENT DOCUMENTS

| | | | | |
|---|---|---|---|---|
| 8,437,192 B2* | 5/2013 | Lung | .................. | G11C 16/0483 365/185.05 |
| 8,848,424 B2* | 9/2014 | Ikeda | .................... | G11C 13/00 365/148 |
| 9,390,792 B2 | 7/2016 | Tang | | |
| 9,627,052 B1 | 4/2017 | Pellizzer et al. | | |
| 9,786,366 B2 | 10/2017 | Tang | | |
| 9,870,820 B2 | 1/2018 | Pellizzer et al. | | |
| 10,153,040 B2 | 12/2018 | Pellizzer et al. | | |
| 10,157,643 B2* | 12/2018 | Laurent | .................... | G11C 8/10 |
| 10,163,501 B2 | 12/2018 | Tang | | |
| 10,381,364 B2* | 8/2019 | Zhou | .................. | H01L 21/8221 |
| 2019/0080756 A1 | 3/2019 | Pellizzer et al. | | |

FOREIGN PATENT DOCUMENTS

WO    2015099962 A1    7/2015

* cited by examiner

*Primary Examiner* — Pho M Luu
(74) *Attorney, Agent, or Firm* — Holland & Hart LLP

(57) ABSTRACT

Methods, systems, and devices for a decoder are described. The memory device may include a substrate, an array of memory cells coupled with the substrate, and a decoder coupled with the substrate. The decoder may include a doped material that may extend between a first conductive line and an access line of the array of memory cells in a first direction (e.g., away from a surface of the substrate) and the doped material may be configured to selectively couple the first conductive line of the decoder with the access line of the array of memory cells. The access line may be coupled with two decoders, in some cases.

24 Claims, 11 Drawing Sheets

VERTICAL DECODERS

BACKGROUND

The following relates generally to operating a memory array and more specifically to vertical decoders.

Memory devices are widely used to store information in various electronic devices such as computers, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. Improved solutions for saving space in the memory array, increasing the memory cell density, or decreasing overall power usage of the memory array may be desired.

DETAILED DESCRIPTION

Some memory devices may include one or more decoders coupled with the memory array. In some cases, the one or more decoders may each include doped materials formed in a specific orientation to reduce the array size of the die used by the one or more decoders. For example, the one or more decoders may include doped materials that extend in a direction that is non-parallel (e.g., perpendicular) a surface of a substrate. The doped material may extend from the conductive line of the one or more decoders to an access line associated with the memory array. In accordance with teachings herein, the one or more decoders may be coupled with the substrate and a side of the memory array and configured to apply a voltage to the access line of the memory array.

To save space and resources, the one or more decoders that each include vertical doped materials may be implemented as part of or in the self-selecting memory array. In some examples, the decoders may be examples of row decoders implemented to bias one or more word-lines or examples of column decoders implemented to bias one or more a bit-lines or both. For example, the memory device may include a first row decoder, a second row decoder, a first column decoder, a second column decoder, or a combination thereof. The decoders may be positioned above the memory array, below the memory array, or both. In such cases, the size of the memory array may be reduced based on the placement and/or orientation of the one or more decoders. In addition, the size (e.g., the resistance) of the one or more word-lines and one or bit-lines may also be reduced based on the placement of the one or more decoders. These and other techniques and advantages described herein may thus improve the size and density of the memory array. In some cases, the memory array may be an example of a self-selecting memory array. In some cases, a self-selecting memory array may be fabricated in a three-dimensional fashion and may include vertical memory cells.

Features of the disclosure introduced above are further described below in the context of a memory array. Specific examples are then described for operating the memory array related to vertical decoders in some examples. These and other features of the disclosure are further illustrated by and described with reference to an apparatus diagram and flowcharts that relate to techniques for vertical decoders.

Figure 1:
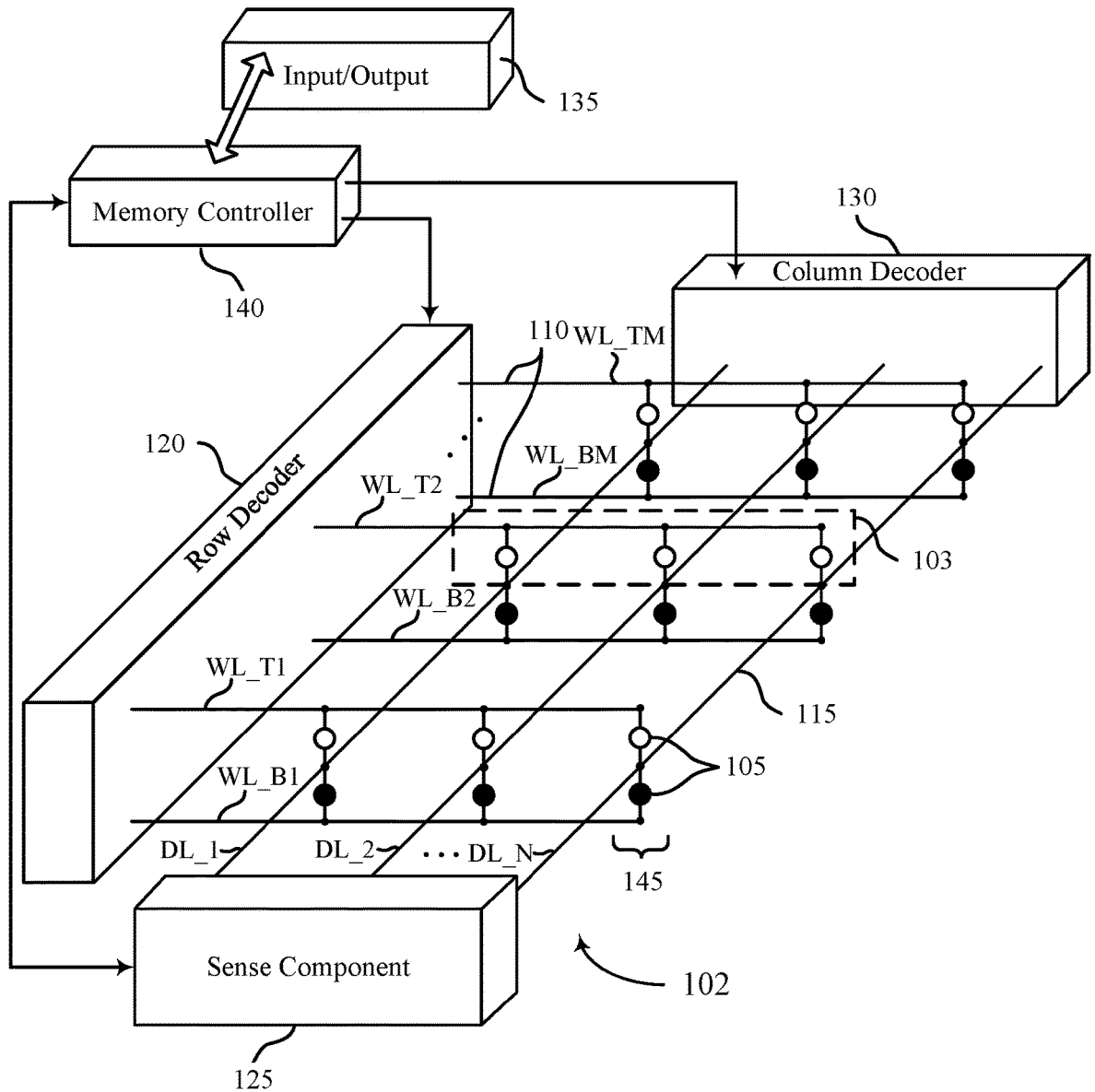
FIG. 1 illustrates an example of a memory device as disclosed herein.

FIG. 1 illustrates an example of a memory device 100 as disclosed herein. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, not their actual physical positions within the memory device 100. In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states. A memory cell 105 may, in some examples, include a self-selecting memory cell. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays 103 formed on top of one another. This may increase a quantity of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the quantity of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple self-selecting memory cells laid on top of another while sharing an access line for both as explained below. In some cases, the self-selecting memory cells may be multi-level self-selecting memory cells configured to store more than one bit of data using multi-level storage techniques.

In some examples, each row of memory cells 105 is connected to an access line 110, and each column of memory cells 105 is connected to a bit line 115. Access lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share an access line 110 with a lower layer. In general, one memory cell 105 may be located at the intersection of two conductive lines such as an access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized to read or write a memory cell 105 at their intersection. Other memory cells 105 that are in electronic communication with (e.g., connected to) the same access line 110 or bit line 115 may be referred to as untargeted memory cells 105.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include a chalcogenide material positioned between a first electrode and a second electrode. One side of the first electrode may be coupled to an access line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different.

Operations such as reading and writing may be performed on memory cells 105 by activating or selecting access line 110 and bit line 115. In some examples, access lines 110 may also be known as word lines 110, and bit lines 115 may also be known digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. For example, memory array 102 may include multiple word lines 110, labeled WL_1 through WL_M, and multiple digit lines 115, labeled DL_1 through DL_N, where M and N depend on the array size. Thus, by activating a word line 110 and a bit line 115, e.g., WL_2 and DL_3, the memory cell 105 at their intersection may be accessed. As discussed below in more detail, accessing memory cells 105 may be controlled through a row decoder 120 and a column decoder 130 that may include one or more doped materials that extend in a direction away from a surface of a substrate coupled to the memory array 102. In some cases, memory device 100 may include a set of row decoders 120 and a set of column decoders 130.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

In some examples, a memory cell may be programmed by providing an electric pulse to the cell, which may include a memory storage element. The pulse may be provided via a first access line (e.g., word line 110) or a second access line (e.g., bit line 115), or a combination thereof. In some cases, upon providing the pulse, ions may migrate within the memory storage element, depending on the polarity of the memory cell 105. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the self-selecting memory cell for achieving the results described herein. This example of a mechanism should not be considered limiting. This disclosure also includes other examples of mechanisms of the self-selecting memory cell for achieving the results described herein.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. An ordinary person skilled in the art would appreciate that sense component may be associated either with column decoder or row decoder without losing its functional purposes.

A memory cell 105 may be set or written by similarly activating the relevant word line 110 and bit line 115 and at least one logic value may be stored in the memory cell 105. Column decoder 130 or row decoder 120 may accept data, for example input/output 135, to be written to the memory cells 105. In the case of a self-selecting memory cell including a chalcogenide material, a memory cell 105 may be written to store a logic state in the memory cell 105 by applying, by the decoder (e.g., row decoder 120 or column decoder 130), the first access voltage to the access line (e.g., word line 110 or bit line 115) coupled with the memory cell 105 as part of the access operation based on identifying the decoder.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and bit line 115. Memory controller 140 may also generate and control various voltages or currents used during the operation of memory device 100.

The memory controller 140 may be configured to receive an access command comprising an instruction to perform the access operation on the memory cell 105. In some cases, the memory controller 140 may be configured to identify a first row decoder (e.g., row decoder 120) of the set of row decoders configured to apply a first access voltage to the access line (e.g., word line 110) coupled with the memory cell 105 as part of the access operation based on receiving the access command. The memory controller 140 may be configured to issue a command for the first row decoder to apply the first access voltage to the access line coupled with the memory cell 105 as part of the access operation of the memory cell based on identifying the first row decoder.

In some examples, the memory controller 140 may be configured to identify a second row decoder (e.g., row decoder 120) of the set of row decoders. For example, the second row decode may be configured to apply a second access voltage to the access line (e.g., word line 110) coupled with the memory cell 105 as part of the access operation based on receiving the access command. The memory controller 140 may be configured to issue a command for the second row decoder to apply the second access voltage to the access line coupled with the memory cell 105 as part of the access operation based on identifying the second row decoder.

The memory controller 140 may delay an application of the first access voltage to the access line based on identifying the second row decoder to apply the second access voltage. In such cases, applying the second access voltage to the access line occurs at the same time as applying the first access voltage to the access line. In some examples, the memory controller 140 may select the memory cell 105 based on applying the first access voltage.

Figure 2:
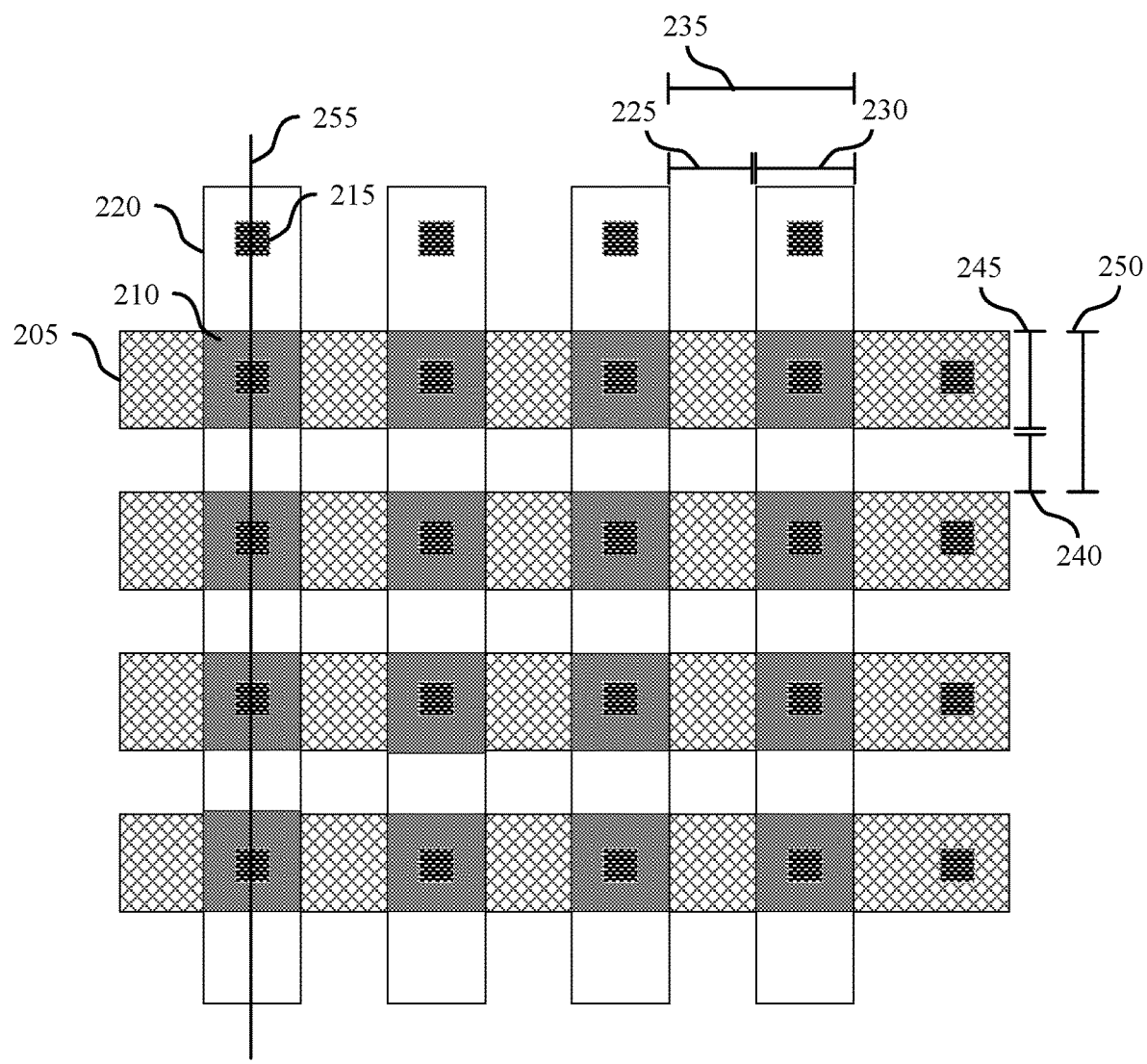
FIG. 2 illustrates an example of a top-down view of a decoder as disclosed herein.

FIG. 2 illustrates an example of a top-down view of a decoder 200 as disclosed herein. Decoder 200 may be an example of a row decoder 120 or column decoder 130 described with reference to FIG. 1. Decoder 200 may include doped material 210 that extends in a direction away from a surface of the substrate (not shown). Decoder 200 may be an example of a last level decoder of a memory array.

Decoder 200 may include at least first conductive line 205. In some cases, decoder 200 may include a plurality of first conductive lines 205. First conductive line 205 may be configured to carry a voltage that is applied to the access line of the array of memory cells (not shown). For example, each first conductive line 205 may receive a signal from an access line within decoder 200. First conductive line 205 may extend in a second direction.

In some cases, decoder 200 may include doped materials 210 that may extend between first conductive line 205 and the access line (not shown). For example, doped material 210 may extend in a direction (e.g., first direction) away from the surface of the substrate. In some cases, the direction may be perpendicular or orthogonal to a plane defined by a surface of the substrate.

For example, the second direction may be perpendicular to the first direction in which the first conductive line 205 extends. Doped material 210 may be configured to selectively couple first conductive line 205 of decoder 200 with the access line. In some cases, doped material 210 may comprise a semiconductor material such as polysilicon. In some cases, polysilicon may be deposited at a lower temperature than other materials, thereby increasing the compatibility between the polysilicon material of decoder 200 and the memory array.

Decoder 200 may also include contacts 215. Contact 215 may extend between doped material 210 and other conductive lines of the decoder 200 or access lines of the array of memory cells. In some cases, doped material 210 may selectively couple first conductive line 205 of decoder 200 with contact 215. Contact 215 may also extend between conductive material 220 and a conductive line (not shown).

In some examples, decoder 200 may include at least one conductive material 220. Conductive material 220 may be coupled with doped material 210. In some cases, conductive material 220 may be configured to carry a second voltage (e.g., different voltage than the voltage applied to the access line) for causing doped material 210 to selectively couple first conductive line 205 with the access line the memory array (e.g., array of memory cells). In that case, one or more conductive materials 220 may receive a signal from an access line associated with the memory array. In some cases, the access line may be an example of a word line. Each conductive material 220 may contact to an access line of the memory array.

In some cases, decoder 200 may include one or more transistors. For example, doped material 210 and conductive material 220 may comprise a transistor. The transistor may selectively couple first conductive line 205 with the access line of the memory array. In that case, conductive material 220 may be an example of a gate of the transistor and doped material 210 may be an example of a source of the transistor, a drain of the transistor, or both. In some cases, conductive material 220 may contact an oxide of doped material 210.

The transistor may be an example of a nMOS type transistor or a pMOS type transistor. In some cases, polysilicon transistors as decoders may allow for large degree of freedom as compared to polysilicon transistors as selectors in the back-end of the memory array. For example, polysilicon transistors in the front-end of the memory array may allow the use of a higher thermal budget for dopant activation, thereby reducing the device engineering complexity. In some cases, a gate oxide may be positioned between the conductive material 220 and the doped material 210.

In some examples, if decoder 200 includes doped material 210 that extends in a direction away from a surface of the substrate, the size and dimensions of decoder 200 may be optimized. For example, distance 225 between two conductive materials 220 may decrease when a vertical decoder is implemented. In some cases, width 230 of conductive material 220 may also decrease when a vertical decoder is implemented. In some examples, the combined distance 235 of distance 225 and width 230 may decrease when a vertical decoder is implemented.

In some cases, distance 240 between two first conductive lines 205 may increase when a vertical decoder is implemented. In some cases, width 245 of first conductive line 205 may decrease when a vertical decoder is implemented. The combined distance 250 of distance 240 and width 245 may decrease when a vertical decoder is implemented. As described below in further detail, decoder 200 may be viewed via perspective line 255.

Figure 3:
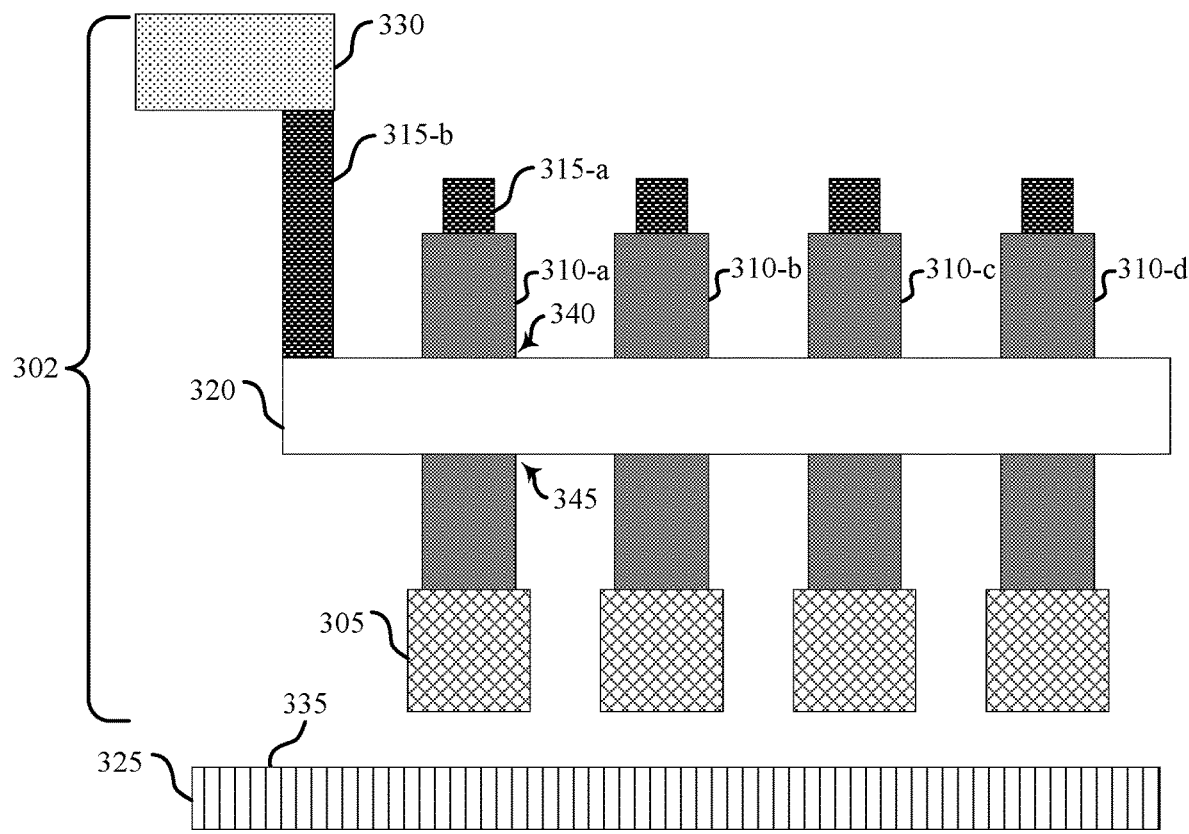
FIG. 3 illustrates an example of a cross-sectional view of a portion of a memory array that supports vertical decoders as disclosed herein.

FIG. 3 illustrates an example of a cross-sectional view of a portion of a memory array 300 that supports vertical decoders as disclosed herein. The portion of the memory array 300 may include a decoder 302 that may include doped materials 310-*a*, 310-*b*, 310-*c*, and/or 310-*d* that extend in a direction away from a surface 335 of the substrate 325. Decoder 302 may be an example of decoder 200 as described with reference to FIG. 2. Doped materials 310-*a*, 310-*b*, 310-*c*, and 310-*d* may be examples of doped material 210 described with reference to FIG. 2.

The portion of the memory array 300 may include substrate 325. In some examples, decoder 302 may be coupled with substrate 325. Substrate 325 may be above or below decoder 302. In some cases, decoder 302 may be configured to apply a voltage to an access line of an array of memory cells (e.g., a word line or digit line) as part of an access operation. In some cases, one or more decoders may be configured to apply a voltage to a same access line of the array of memory cells. Decoder 302 may also include first conductive line 305, which may be an example of first conductive line 205 as described in reference to FIG. 2. In some cases, first conductive line 305 may be directly coupled with doped material 310-*a*.

In some cases, decoder 302 may include doped materials 310-*a* through 310-*d*. Doped materials 310-*a* through 310-*d* may be a polysilicon material. In some examples, doped materials 310-*a* through 310-*d* may extend between first conductive line 305 and the access line of the array of memory cells (e.g., word line or digit line) in a direction away from a surface 335 of substrate 325. For example, doped materials 310-*a* through 310-*d* may extend orthogonally from a plane defined by the surface 335 of substrate 325.

In some examples, doped material 310 may be include a first doped region 340 and a second doped region 345. For example, the first doped region 340 may be a first distance away from the surface 335 of substrate 325, and the second doped region 345 may be a second distance away from the surface 335 of substrate 325. In that case, the first distance and the second distance away from the surface 335 of substrate 325 may be different. In some cases, the first doped region 340 and the second doped region 345 may include similarly doped materials. In other examples, the first doped region 340 and the second doped region 345 may include different doped materials. For example, the first doped region 340 may include polysilicon and the second doped region 345 may include a different semiconductor material.

Decoder 302 may include one or more contacts 315 including contacts 315-*a* and 315-*b*, which may be examples of contact 215 described in reference to FIG. 2. Contact 315-*a* may extend between doped material 310-*a* and the access line of the array of memory cells. In such cases, contact 315-*a* may be directly coupled with doped material 310-*a*. In some cases, doped material 310-*a* may selectively couple first conductive line 305 of decoder 302 with contact 315-*a*.

Decoder 302 may also include conductive material 320 that may be coupled with doped material 310-*a* and 310-*b*, and which may be an example of conductive material 220 as described in reference to FIG. 2. Conductive material 320 may be configured to carry a voltage for causing doped material 310-*a* to selectively couple first conductive line 305 with the access line or the contact 315-*a*. In some cases, conductive material 320 may be directly coupled with a surface of doped material 310-*a*. For example, conductive material 320 may be coupled with a surface of doped material 310-*a*. Conductive material 320 may contact an oxide of doped material 310-*a*. In some examples, conductive material 320 may extend in a direction parallel to the surface of substrate 325. Doped material 310-*a* may extend in a direction perpendicular to a surface of the conductive material 320.

In some cases, decoder 302 may include conductive line 330. Conductive line 330 may be coupled to contact 315-*b*. For example, contact 315-*b* may extend between conductive line 330 and conductive material 320. Conductive line 330 may carry a voltage for causing doped material 310-*a* to couple first conductive line 305 of decoder 302 with the access line. In some cases, contact 315-*b* may carry the voltage from conductive line 330 to conductive material 320 as part of the access operation. Conductive line 330 may extend in a direction parallel to the surface of substrate 325. In that case, doped material 310-*a* may extend in a direction perpendicular to a surface of the conductive line 330. In some cases, the first conductive line 305 may be an example of a global word line or global digit line of the decoder 302 and the conductive line 330 may be an example of a local word line or a local digit line of the decoder 302.

As described herein, the memory device may include one or more decoders 302. The size of the memory array may be increased based on the placement/or orientation of the one or more decoders 302. In such cases, the decoders 302 may be positioned above the memory array, below the memory array, or both (e.g., each decoder 302 opposite of each other), thereby reducing the size of the memory array. In addition, the size of the first conductive line 305 may be reduced based on the placement of the one or more decoders 302. For example, one or more decoders 302 may be coupled with a same first conductive line 305 of the memory array, thereby reducing the resistance of the first conductive line 305.

Figure 4:
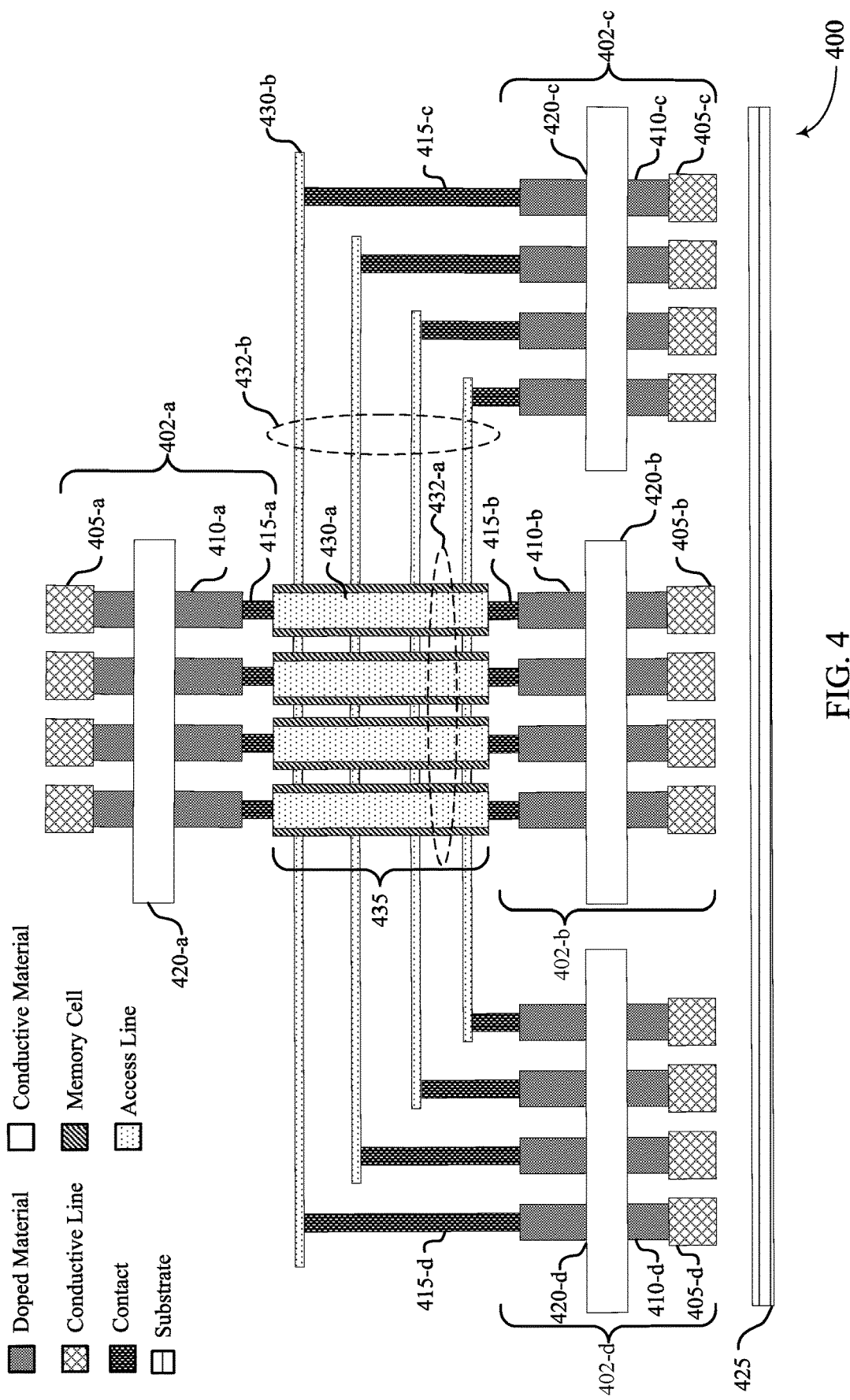
FIGS. 4-7 illustrate examples of memory arrays that support vertical decoders as disclosed herein.

FIG. 4 illustrates an example of a memory array 400 that supports vertical decoders as disclosed herein. Memory array 400 may include decoders 402-*a*, 402-*b*, 402-*c*, 402-*d*, substrate 425, an array of memory cells 435, first set of access lines 432-*a*, and second set of access lines 432-*b*. Decoders 402-*a*, 402-*b*, 402-*c*, 402-*d* and substrate 425 may be examples of decoder and substrate, as described in reference to FIGS. 3 and 4. Memory array 400 may include the array of memory cells 435 coupled with substrate 425. In some cases, set of access lines 432-*a* may comprise word lines or digit lines. In some examples, the set of access lines 432-*b* may comprise bit lines or digit lines or word lines. In other examples, memory array 400 may be an example a cross-point architecture, a pillar architecture, or a planar architecture. Memory array 400 may be an example of an electrical schematic representation.

Decoders 402-*a* and 402-*b* may each be an example of a vertical row decoder as described herein. Decoder 402-*a* may be an example of a first row decoder coupled with substrate 425 and a first side of the array of memory cells 435. In some cases, decoder 402-*a* may include conductive lines 405-*a* (e.g., first conductive line), doped materials 410-*a*, contacts 415-*a*, and conductive material 420-*a*, which may be examples of conductive lines, doped materials, contact, and conductive materials, as described in reference to FIGS. 2 and 3. In some examples, decoder 402-*a* may be positioned above the array of memory cells 435.

Decoder 402-*a* may apply a first voltage to an access line 430-*a* of set of access lines 432-*a* as part of an access operation. Conductive line 405-*a* may carry the first voltage for the access operation. In some cases, conductive line 405-*a* may be coupled to the access line 430-*a* of the set of access lines 432-*a* based on applying the first voltage. For example, the contact 415-*a* may carry a signal from another conductive line to cause the conductive line 405-*a* to be coupled with the access line 430-*a*. The contact 415-*a* may couple the doped material 410-*a* with the access line 430-*a*.

In some cases, access line 430-*a* may be selected based on activating the conductive line 405-*a* and the conductive material 420-*a*. The first voltage may also be applied to a memory cell of the array of memory cells 435 based on coupling conductive line 405-*a* to the access line 430-*a*. In some cases, a logic state stored in the memory cell of the array of memory cells 435 may be outputted based on applying the first voltage. In that case, the access operation may be a read operation. In some examples, a logic state may be stored in the memory cell of the array of memory cells 435 based on applying the first voltage. In that case, the access operation may be a write operation.

Doped material 410-*a* may extend between conductive line 405-*a* and one of the set of access lines 432-*a* (or contacts 415-*a*) in a direction that is non-parallel (e.g., perpendicular) to the surface of substrate 425. That is, doped material 410-*a* may extend in a direction that is non-parallel (e.g., perpendicular) to a surface of conductive material 420-*a*. In some cases, conductive line 405-*a* and access line 430-*a* may be selectively coupled via doped material 410-*a*.

Decoder 402-*b* may be an example of a second row decoder coupled with substrate 425 and a second side of the array of memory cells 435. For example, the array of memory cells 435 may be positioned between decoder 402-*a* and decoder 402-*b*. In some cases, decoder 402-*b* may include conductive lines 405-*b* (e.g., second conductive line), doped materials 410-*b*, contacts 415-*b*, and conductive material 420-*b*, which may be examples of conductive lines, doped materials, contact, and conductive materials, as described in reference to FIGS. 2 and 3. In some examples, decoder 402-*b* may be positioned below the array of memory cells 435.

Decoder 402-*b* may apply a second voltage to the access line 430-*a* of set of access lines 432-*a* as part of an access operation. Conductive line 405-*b* may carry the second voltage for the access operation. In some cases, conductive line 405-*b* may be coupled to the access line 430-*a* of the set of access lines 432-*a* based on applying the second voltage. For example, the contact 415-*b* may carry a signal from another conductive line to cause the conductive line 405-*b* to be coupled with the access line 430-*a*. The contact 415-*b* may couple the doped material 410-*b* with the access line 430-*a*. In some cases, access line 430-*a* may be selected based on activating the conductive line 405-*b* and the conductive material 420-*b*. The second voltage may also be applied to a memory cell of the array of memory cells 435 based on coupling conductive line 405-*b* to the access line 430-*a*.

In some cases, a logic state stored in the memory cell of the array of memory cells 435 may be outputted based on applying the first voltage and the second voltage. In such cases, the access operation may be a read operation. In some examples, a logic state may be stored in the memory cell of the array of memory cells 435 based on applying the first voltage and the second voltage. In that case, the access operation may be a write operation. In some cases, the voltage applied to the access line 430-*a* may be split between the first voltage and the second voltage. For example, the first voltage applied by the decoder 402-*a* may include a portion of the voltage applied to the access line 430-*a*, and the second voltage applied by decoder 402-*b* may include the other portion of the voltage applied to the access line 430-*a*.

In some examples, decoder 402-*a* may apply the first voltage at the same time as decoder 402-*b* may apply the second voltage. For example, decoder 402-*a* and decoder 402-*b* may operate in parallel. In other examples, decoder 402-*a* may apply the first voltage at a different time as decoder 402-*b* may apply the second voltage. For example, the application of the first voltage may be delayed in order to apply the first voltage and the second voltage at the same time.

Doped material 410-*b* may extend between conductive line 405-*b* and one of the set of access lines 432-*a* (or contacts 415-*b*) in a direction that is non-parallel (e.g., perpendicular) to the surface of substrate 425. That is, doped material 410-*b* may extend in a direction that is non-parallel (e.g., perpendicular) to a surface of conductive material 420-*b*. In some cases, conductive line 405-*b* and access line 430-*a* may be selectively coupled via doped material 410-*b*.

As described herein, memory array 400 may include decoder 402-*a* and decoder 402-*b*. The size of the memory array 400 may be reduced based on the placement/or orientation of decoder 402-*a* and decoder 402-*b*. In addition, the size of access line 430-*a* may be reduced based on the placement/or orientation of decoder 402-*a* and decoder 402-*b* and/or the reduction in the amount of voltage carried over the access line. For example, if two decoders are used to bias an access line to a particular voltage, the amount voltage/current applied by each decoder may be less than the amount of voltage applied by a single decoder. In some cases, the worst case access resistance (e.g., parasitic resistance) of access line 430-*a* may be reduced of a fourth of the total resistance of the array of memory cells 435.

In some cases, memory array 400 may include decoder 402-*c* which may be a first column decoder. For example, decoder 402-*c* may be coupled with substrate 425 and a third side of the array of memory cells 435. In some cases, decoder 402-*c* may include conductive lines 405-*c*, doped materials 410-*c*, contacts 415-*c*, and conductive material 420-*c*. In some examples, decoder 402-*c* may be positioned above the array of memory cells 435 or below the array of memory cells 435 (not shown).

In some cases, fabrication techniques to form memory array 400 may include a different masking step to form each of the different lengths of contacts 415-*c* (e.g., the distance between doped material 410-*c* and access line 430-*b*). In some examples, the contacting scheme may be an example of a staggered configuration. For example, the length of contact 415-*c* may increase as the distance between contact 415-*c* and the array of memory cells 435 increases. In such cases, the top access line 430-*b* may extend further than the bottom access line 430-*b*. The contacting scheme may be implemented via additional conductive layers (not shown). In some examples, a single masking step after deposition may be implemented to obtain the contacting scheme (e.g., staggered configuration).

In some examples, decoder 402-*c* may apply a third voltage to the access line 430-*b* of the set of access lines 432-*b* as part of the access operation. Conductive line 405-*c* may carry the third voltage for selecting a memory cell of the array of memory cells 435 as part of the access operation. The contact 415-*c* may couple the doped material 410-*c* with the access line 430-*b*. In some cases, the access line 430-*b* may be selected based on activating the conductive line 405-*c* and the conductive material 420-*c*. In some cases, the contact 415-*c* may carry a signal from another conductive line to cause conductive line 405-*c* to be coupled with the access line 430-*b*.

A memory cell included in the array of memory cells 435 may be selected based on the intersection of activated access lines 430-*a* and 430-*b*. For example, the intersection of the first voltage and second voltages and the third voltage may select the memory cell. In that case, the signal applied to the memory cell of the array of memory cells 435 may have a positive or negative polarity.

In some cases, doped material 410-*c* may extend between conductive line 405-*c* and one of the set of access lines 432-*b* (or contacts 415-*c*) in a direction that is non-parallel (e.g., perpendicular) to the surface of substrate 425. Conductive line 405-*c* and access line 430-*b* may be coupled via doped material 410-*c*.

In some cases, memory array 400 may include decoder 402-*d* which may be a second column decoder. For example, decoder 402-*d* may be coupled with substrate 425 and a fourth side of the array of memory cells 435. For example, the array of memory cells 435 may be positioned between decoder 402-*c* and decoder 402-*d*. In some cases, decoder 402-*d* may include conductive lines 405-*d*, doped materials 410-*d*, contacts 415-*d*, and conductive material 420-*d*. In some examples, decoder 402-*d* may be positioned above the array of memory cells 435 (not shown) or below the array of memory cells 435.

In some cases, fabrication techniques to form memory array 400 may include a different masking step to form each of the different lengths of contacts 415-*d* (e.g., the distance between doped material 410-*d* and access line 430-*b*). In some examples, the contacting scheme may be an example of a staggered configuration. For example, the length of contact 415-*d* may increase as the distance between contact 415-*d* and the array of memory cells 435 increases. In such cases, the top access line 430-*b* may extend further than the bottom access line 430-*b*. The contacting scheme may be implemented via additional conductive layers (not shown). In some examples, a single masking step after deposition may be implemented to obtain the contacting scheme (e.g., staggered configuration).

In some examples, decoder 402-*d* may apply a fourth voltage to the access line 430-*b* of the set of access lines 432-*b* as part of the access operation. Conductive line 405-*b* may carry the fourth voltage for selecting a memory cell of the array of memory cells 435 as part of the access operation. The contact 415-*d* may couple the doped material 410-*d* with the access line 430-*b*. In some cases, the access line 430-*b* may be selected based on activating the conductive line 405-*d* and the conductive material 420-*d*. In some cases, the contact 415-*d* may carry a signal from another conductive line to cause conductive line 405-*d* to be coupled with the access line 430-*b*.

A memory cell included in the array of memory cells 435 may be selected based on the intersection of activated access lines 430-*a* and 430-*b*. For example, the intersection of the first voltage and second voltages and the fourth voltage may select the memory cell. In that case, the signal applied to the memory cell of the array of memory cells 435 may have a positive or negative polarity. In some cases, the voltage applied to the access line 430-*b* may be split between the third voltage and the fourth voltage. For example, the third voltage applied by the decoder 402-*c* may include a portion of the voltage applied to the access line 430-*b*, and the fourth voltage applied by decoder 402-*d* may include the other portion of the voltage applied to the access line 430-*b*. In some examples, decoder 402-*c* may apply the third voltage at the same time as decoder 402-*d* may apply the fourth voltage. For example, decoder 402-*c* and decoder 402-*d* may operate in parallel.

In other examples, decoder 402-*c* may apply the third voltage at a different time as decoder 402-*d* may apply the fourth voltage. For example, the application of the third voltage may be delayed in order to apply the third voltage and the fourth voltage at the same time.

In some cases, doped material 410-*d* may extend between conductive line 405-*d* and one of the set of access lines 432-*b* (or contacts 415-*d*) in a direction that is non-parallel (e.g., perpendicular) to the surface of substrate 425. Conductive line 405-*d* and access line 430-*b* may be coupled via doped material 410-*d*.

As described herein, memory array 400 may include decoder 402-*c* and decoder 402-*d*. The size of the memory array 400 may be reduced based on the placement/or orientation of decoder 402-*c* and decoder 402-*d*. In addition, the size of access line 430-*b* may be reduced based on the placement/or orientation of decoder 402-*c* and decoder 402-*d* and/or the reduction in the amount of voltage carried over the access line. For example, if two decoders are used to bias an access line to a particular voltage, the amount voltage applied by each decoder may be less than the amount of voltage applied by a single decoder. In some cases, the resistance (e.g., parasitic resistance) of access line 430-*b* may be reduced to a fourth of the total resistance of the array of memory cells 435.

Figure 5:
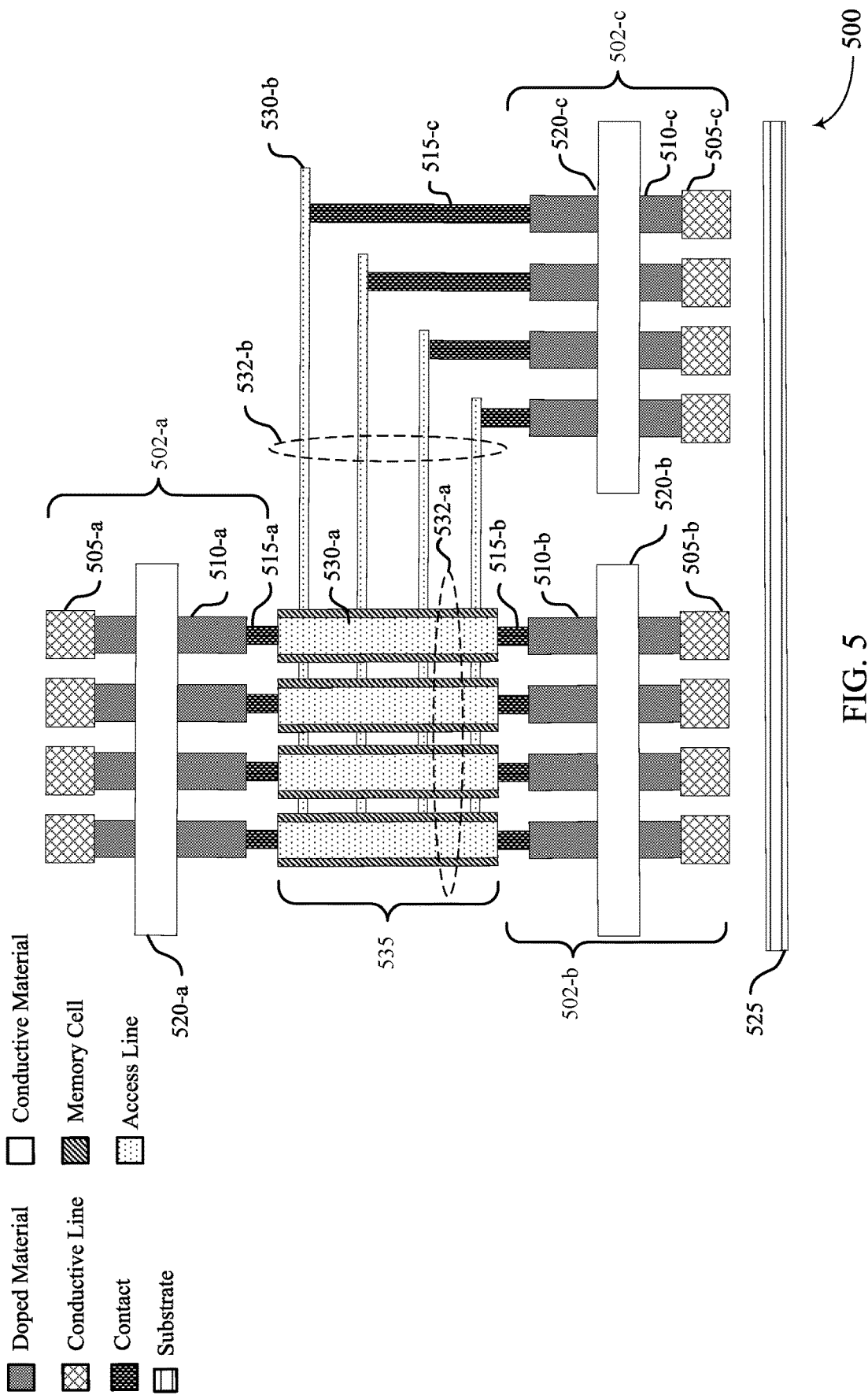

FIG. 5 illustrates an example of a memory array 500 that supports vertical decoders as disclosed herein. Memory array 500 may include decoders 502-*a*, 502-*b*, and 502-*c*, substrate 525, an array of memory cells 535, first set of access lines 532-*a*, and second set of access lines 532-*b*. Decoders 502-*a*, 502-*b*, and 502-*c* and substrate 525 may be examples of decoder and substrate, as described in reference to FIGS. 2-5. Memory array 500 may include the array of memory cells 535 coupled with substrate 525. In some cases, set of access lines 532-*a* may comprise word lines or digit lines. In some examples, the set of access lines 532-*b* may comprise bit lines or digit lines or word lines. In other examples, memory array 500 may be an example a cross-point architecture, a pillar architecture, or a planar architecture. Memory array 500 may be an example of an electrical schematic representation and may be an example of memory array 400, as described in reference to FIG. 4.

Decoder 502-*a* may be an example of a first row decoder coupled with substrate 525 and a first side of the array of memory cells 535. For example, decoder 502-*a* may be an example of and perform the methods of decoder 402-*a*, as described in refence to FIG. 4. In some cases, decoder 502-*a* may include conductive lines 505-a (e.g., first conductive line), doped materials 510-a, contacts 515-a, and conductive material 520-a, which may be examples of conductive lines, doped materials, contact, and conductive materials, as described in reference to FIGS. 2-4. In some examples, decoder 502-a may be positioned above the array of memory cells 535.

In some cases, memory array 500 may include decoder 502-b. Decoder 502-b may be an example of a second row decoder coupled with substrate 525 and a second side of the array of memory cells 535. For example, the array of memory cells 535 may be positioned between decoder 502-a and decoder 502-b. Decoder 502-b may be an example of and perform the methods of decoder 402-b, as described in refence to FIG. 4. In some cases, decoder 502-b may include conductive lines 505-b (e.g., second conductive line), doped materials 510-b, contacts 515-b, and conductive material 520-b, which may be examples of conductive lines, doped materials, contact, and conductive materials, as described in reference to FIGS. 2-4. In some examples, decoder 502-b may be positioned below the array of memory cells 535.

In some cases, memory array 500 may include decoder 502-c which may be a first column decoder. For example, decoder 502-c may be coupled with substrate 525 and a third side of the array of memory cells 535. Decoder 502-c may be an example of and perform the methods of decoder 402-c, as described in refence to FIG. 4. In some cases, decoder 502-c may include conductive lines 505-c, doped materials 510-c, contacts 515-c, and conductive material 520-c, which may be examples of conductive lines, doped materials, contact, and conductive materials, as described in reference to FIGS. 2-4. In some examples, decoder 502-c may be positioned above the array of memory cells 535 or below the array of memory cells 535 (not shown).

As described herein, memory array 500 may include decoder 502-a and decoder 502-b. The size of the memory array 500 may be reduced based on the placement/or orientation of decoder 502-a and decoder 502-b. In addition, the size of access line 530-a may be reduced based on the placement/or orientation of decoder 502-a and decoder 502-b. For example, the worst case access resistance (e.g., parasitic resistance) of access line 530-a may be reduced of a fourth of the total resistance of the array of memory cells 535. In some examples, the size of access line 530-b may remain unchanged based on the placement/or orientation of decoder 502-c. In such cases, a size of the access line 530-a may be smaller than a size of the access line 530-b. In some cases, the resistance of access line 530-b may be equal to the total resistance of the array of memory cells 535.

Figure 6:
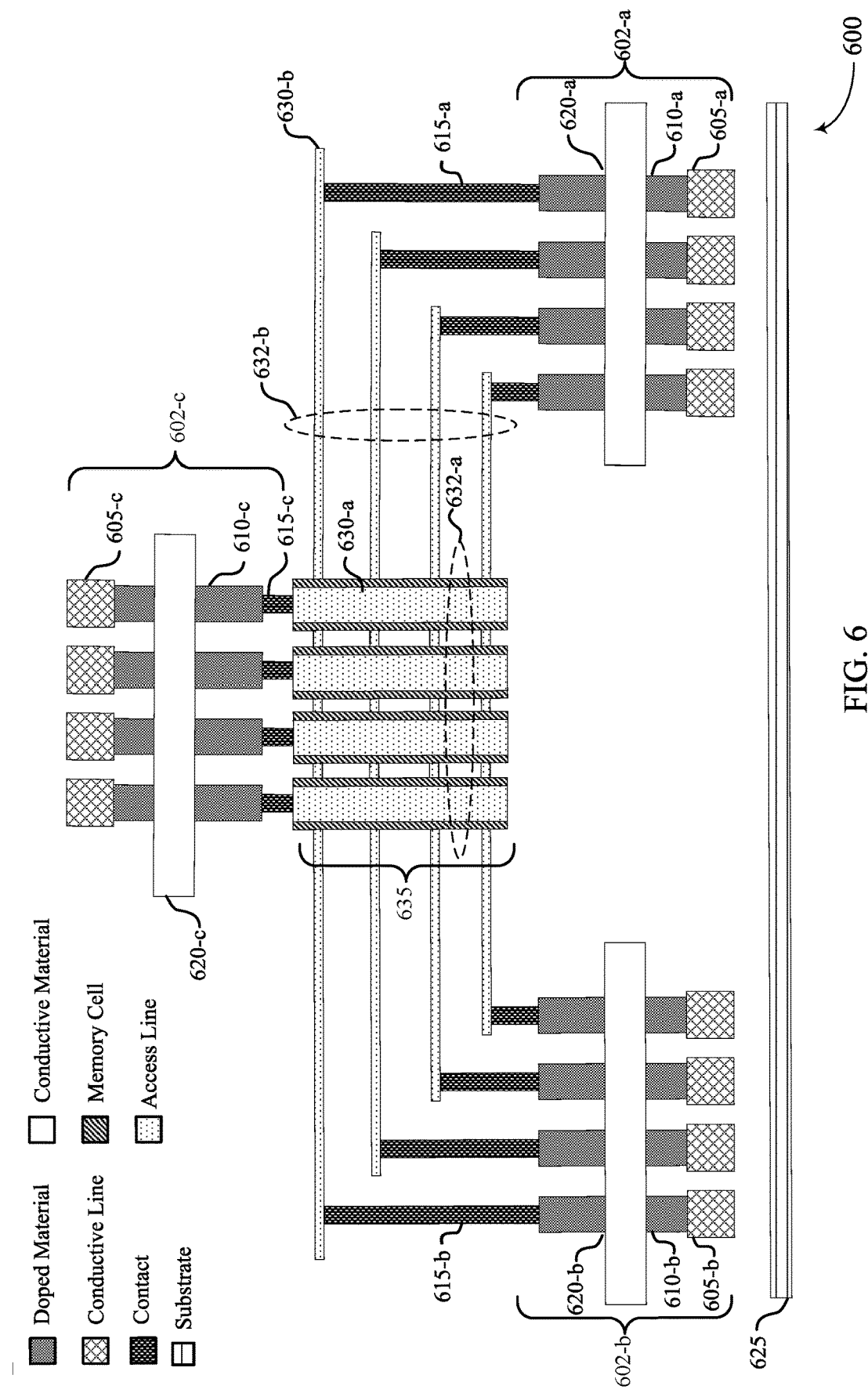

FIG. 6 illustrates an example of a memory array 600 that supports vertical decoders as disclosed herein. Memory array 600 may include decoders 602-a, 602-b, and 602-c, substrate 625, an array of memory cells 635, first set of access lines 632-a, and second set of access lines 632-b. Decoders 602-a, 602-b, and 602-c and substrate 625 may be examples of decoder and substrate, as described in reference to FIGS. 2-5. Memory array 600 may include the array of memory cells 635 coupled with substrate 625. In some cases, set of access lines 632-a may comprise word lines or digit lines. In some examples, the set of access lines 632-b may comprise bit lines or digit lines or word lines. In other examples, memory array 600 may be an example a cross-point architecture, a pillar architecture, or a planar architecture. Memory array 600 may be an example of an electrical schematic representation and may be an example of memory array 400 and 500, as described in reference to FIGS. 4 and 5.

Decoder 602-a may be an example of a first column decoder coupled with substrate 625 and a first side of the array of memory cells 635. For example, decoder 602-a may be an example of and perform the methods of decoder 402-c and 502-c, as described in refence to FIGS. 4 and 5. In some cases, decoder 602-a may include conductive lines 605-a (e.g., first conductive line), doped materials 610-a, contacts 615-a, and conductive material 620-a, which may be examples of conductive lines, doped materials, contact, and conductive materials, as described in reference to FIGS. 2-5. In some examples, decoder 602-a may be positioned above the array of memory cells 635. Decoder 602-a may be configured to access the array of memory cells 635 coupled with access line 630-b (e.g., first access line).

In some cases, memory array 600 may include decoder 602-b. Decoder 602-b may be an example of a second column decoder coupled with substrate 625 and a second side of the array of memory cells 635. For example, the array of memory cells 635 may be positioned between decoder 602-a and decoder 602-b. Decoder 602-b may be an example of and perform the methods of decoder 402-d, as described in refence to FIG. 4. In some cases, decoder 602-b may include conductive lines 605-b (e.g., second conductive line), doped materials 610-b, contacts 615-b, and conductive material 620-b, which may be examples of conductive lines, doped materials, contact, and conductive materials, as described in reference to FIGS. 2-5. In some examples, decoder 602-b may be positioned below the array of memory cells 635. Decoder 602-b may be configured to access the array of memory cells 635 coupled with access line 630-b (e.g., first access line).

Decoder 602-a and decoder 602-b may access the same array of memory cells 635 at a same time. In some cases, decoder 602-a and decoder 602-b may access the array of memory cells 635 in a differential access operation. For example, the memory cells of the array of memory cells 635 closer to decoder 602-a than decoder 602-b may receive more energy from decoder 602-a than energy from decoder 602-b. In other examples, the memory cells of the array of memory cells 635 closer to decoder 602-b than decoder 602-a may receive more energy from decoder 602-b than energy from decoder 602-a.

In some cases, memory array 600 may include decoder 602-c which may be a first row decoder. For example, decoder 602-c may be coupled with substrate 625 and a third side of the array of memory cells 635. Decoder 602-c may be an example of and perform the methods of decoder 402-a and 502-a, as described in refence to FIGS. 4 and 5. In some cases, decoder 602-c may include conductive lines 605-c, doped materials 610-c, contacts 615-c, and conductive material 620-c, which may be examples of conductive lines, doped materials, contact, and conductive materials, as described in reference to FIGS. 2-5. In some examples, decoder 602-c may be positioned above the array of memory cells 635 or below the array of memory cells 635 (not shown). In some examples, decoder 602-c may be configured to access the array of memory cells 635 coupled with access line 630-a (e.g., second access line).

As described herein, memory array 600 may include decoder 602-a and decoder 602-b. The size of the memory array 600 may be reduced based on the placement/or orientation of decoder 602-a and decoder 602-b. In addition, the size of access line 630-b may be reduced based on the placement/or orientation of decoder 602-a and decoder 602-b. For example, the worst case access resistance (e.g., parasitic resistance) of access line 630-b may be reduced of a fourth of the total resistance of the array of memory cells 635. In some examples, the size of access line 630-*a* may remain unchanged based on the placement/or orientation of decoder 602-*c*.

In such cases, a size of the access line 630-*b* may be smaller than a size of the access line 630-*a*. In some cases, the resistance of access line 630-*a* may be equal to the total resistance of the array of memory cells 635. In some examples, memory array 600 may include a decrease in performance and cost when compared memory array 500 and 600. In such cases, the size (e.g., footprint) of memory array 600 may be the same as the size (e.g., footprint) of memory array 400, but memory array 600 may include half of the gain on access line 630-*a* due to the presence of a single row decoder (e.g., decoder 602-*c*).

Figure 7:
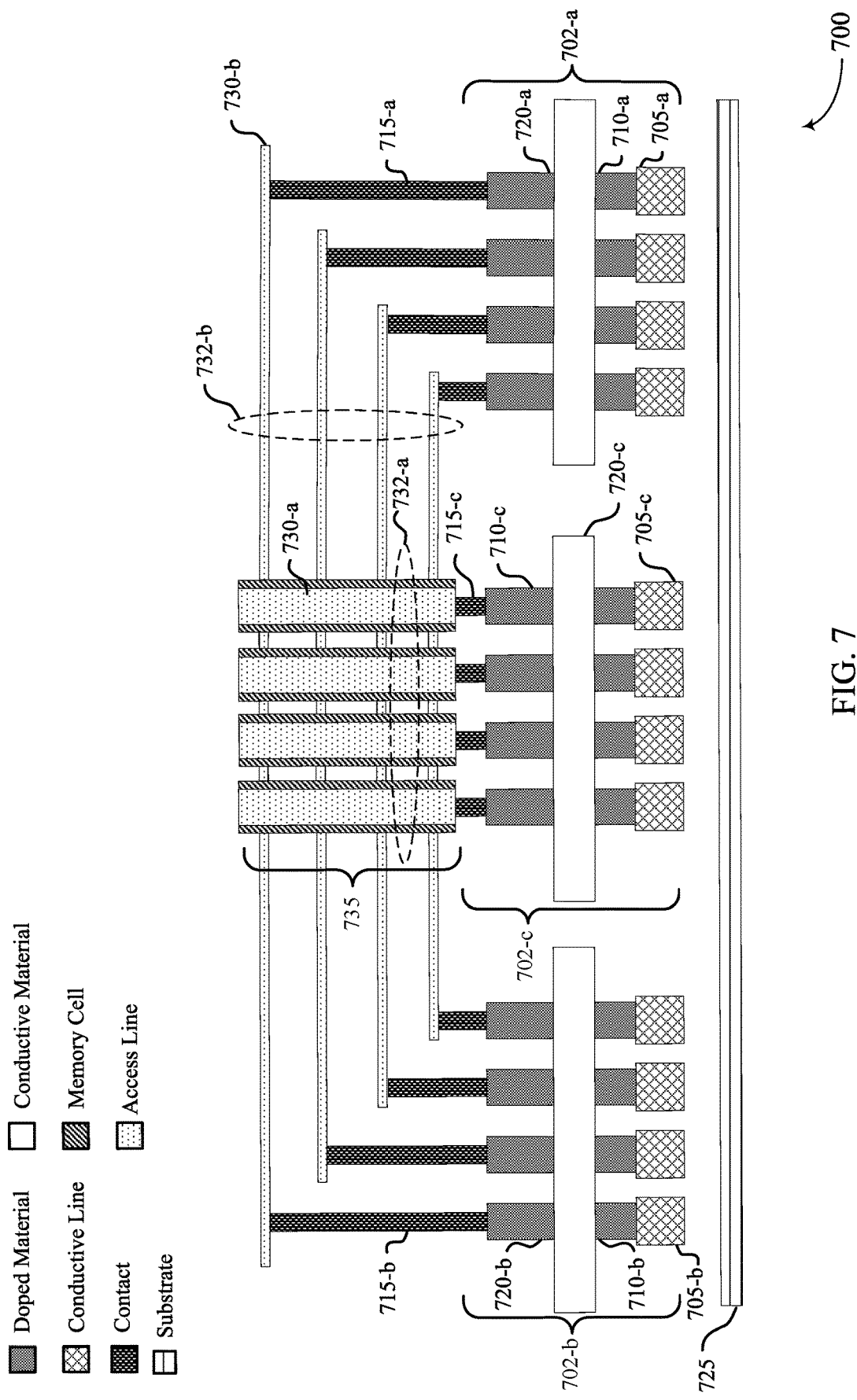

FIG. 7 illustrates an example of a memory array 700 that supports vertical decoders as disclosed herein. Memory array 700 may include decoders 702-*a*, 702-*b*, and 702-*c*, substrate 725, an array of memory cells 735, first set of access lines 732-*a*, and second set of access lines 732-*b*. Decoders 702-*a*, 702-*b*, and 702-*c* and substrate 725 may be examples of decoder and substrate, as described in reference to FIGS. 3-6. Memory array 700 may include the array of memory cells 735 coupled with substrate 725. In some cases, set of access lines 732-*a* may comprise word lines or digit lines. In some examples, the set of access lines 732-*b* may comprise bit lines or digit lines or word lines. In other examples, memory array 700 may be an example a cross-point architecture, a pillar architecture, or a planar architecture. Memory array 700 may be an example of an electrical schematic representation and may be an example of memory array 400, 500, and 600, as described in reference to FIGS. 4-6.

Decoder 702-*a* may be an example of a first column decoder coupled with substrate 725 and a first side of the array of memory cells 735. For example, decoder 702-*a* may be an example of and perform the methods of decoder 402-*c*, 502-*c*, and 602-*a* as described in refence to FIGS. 4-6. In some cases, decoder 702-*a* may include conductive lines 705-*a* (e.g., first conductive line), doped materials 710-*a*, contacts 715-*a*, and conductive material 720-*a*, which may be examples of conductive lines, doped materials, contact, and conductive materials, as described in reference to FIGS. 2-6. In some examples, decoder 702-*a* may be positioned above the array of memory cells 735. Decoder 702-*a* may be configured to access the array of memory cells 735 coupled with access line 730-*b* (e.g., first access line).

In some cases, memory array 700 may include decoder 702-*b*. Decoder 702-*b* may be an example of a second column decoder coupled with substrate 725 and a second side of the array of memory cells 735. For example, the array of memory cells 735 may be positioned between decoder 702-*a* and decoder 702-*b*. Decoder 702-*b* may be an example of and perform the methods of decoder 402-*d* and 602-*b*, as described in refence to FIGS. 4 and 6. In some cases, decoder 702-*b* may include conductive lines 705-*b* (e.g., second conductive line), doped materials 710-*b*, contacts 715-*b*, and conductive material 720-*b*, which may be examples of conductive lines, doped materials, contact, and conductive materials, as described in reference to FIGS. 2-6. In some examples, decoder 702-*b* may be positioned below the array of memory cells 735. Decoder 702-*b* may be configured to access the array of memory cells 735 coupled with access line 730-*b* (e.g., first access line).

Decoder 702-*a* and decoder 702-*b* may access the same array of memory cells 735 at a same time. In some cases, decoder 702-*a* and decoder 702-*b* may access the array of memory cells 735 in a differential access operation. For example, the memory cells of the array of memory cells 735 closer to decoder 702-*a* than decoder 702-*b* may receive more energy from decoder 702-*a* than energy from decoder 702-*b*. In other examples, the memory cells of the array of memory cells 735 closer to decoder 702-*b* than decoder 702-*a* may receive more energy from decoder 702-*b* than energy from decoder 702-*a*.

In some cases, memory array 700 may include decoder 702-*c* which may be a first row decoder. For example, decoder 702-*c* may be coupled with substrate 725 and a third side of the array of memory cells 735. Decoder 702-*c* may be an example of and perform the methods of decoder 402-*b* and 502-*b*, as described in refence to FIGS. 4 and 5. In some cases, decoder 702-*c* may include conductive lines 705-*c*, doped materials 710-*c*, contacts 715-*c*, and conductive material 720-*c*, which may be examples of conductive lines, doped materials, contact, and conductive materials, as described in reference to FIGS. 2-6. In some examples, decoder 702-*c* may be positioned above the array of memory cells 735 (not shown) or below the array of memory cells 735. In some examples, decoder 702-*c* may be configured to access the array of memory cells 735 coupled with access line 730-*a* (e.g., second access line).

As described herein, memory array 700 may include decoder 702-*a* and decoder 702-*b*. The size of the memory array 700 may be reduced based on the placement/or orientation of decoder 702-*a* and decoder 702-*b*. In addition, the size of access line 730-*b* may be reduced based on the placement/or orientation of decoder 702-*a* and decoder 702-*b*. For example, the worst case access resistance (e.g., parasitic resistance) of access line 730-*b* may be reduced of a fourth of the total resistance of the array of memory cells 735. In some examples, the size of access line 730-*a* may remain unchanged based on the placement/or orientation of decoder 702-*c*.

In such cases, a size of the access line 730-*b* may be smaller than a size of the access line 730-*a*. In some cases, the resistance of access line 730-*a* may be equal to the total resistance of the array of memory cells 735. In some examples, memory array 700 may include a decrease in performance and cost when compared memory array 500 and 600. In such cases, the size (e.g., footprint) of memory array 700 may be the same as the size (e.g., footprint) of memory array 400, but memory array 700 may include half of the gain on access line 730-*a* due to the presence of a single row decoder (e.g., decoder 702-*c*).

Figure 8A:
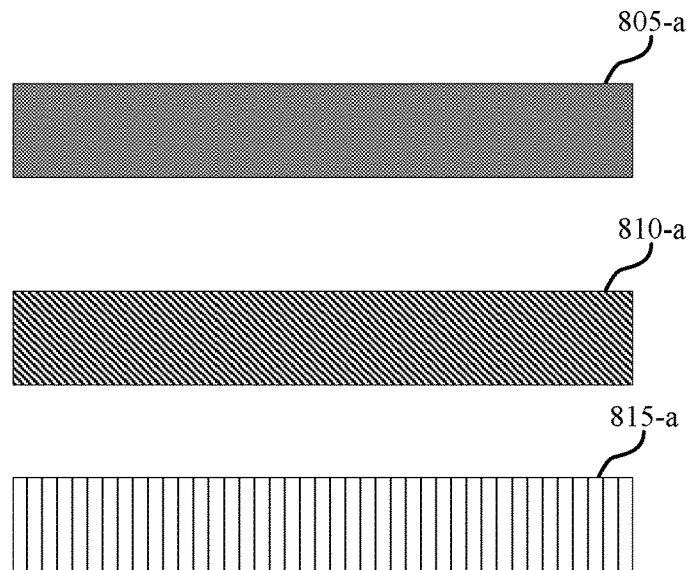
FIGS. 8A and 8B illustrate examples of memory device configurations that support vertical decoders as disclosed herein.

FIG. 8A illustrates an example of a memory device configuration 800-*a* that supports vertical decoders as disclosed herein. Memory device configuration 800-*a* may include decoder 805-*a*, array of memory cells 810-*a*, and substrate 815-*a*, which may be examples of a decoder, array of memory cells, and substrate, as described in reference to FIGS. 2-7. In some cases, array of memory cells 810-*a* may be positioned between substrate 815-*a* and decoder 805-*a*.

Figure 8B:
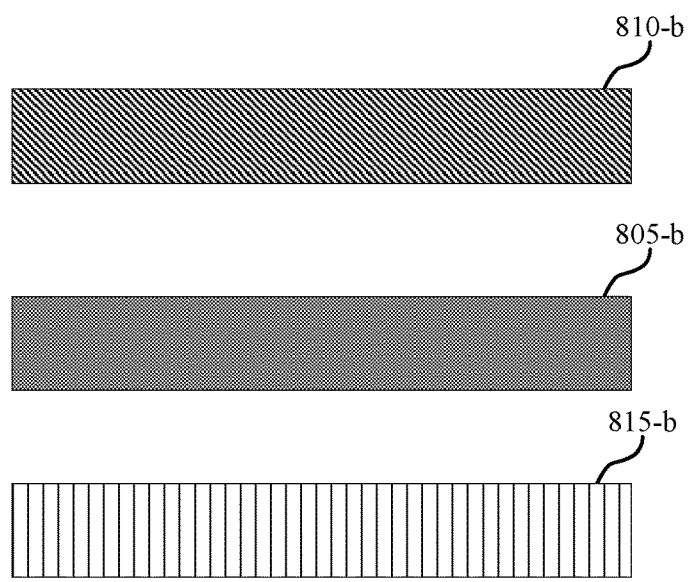

FIG. 8B illustrates an example of a memory device configuration 800-*b* that supports vertical decoders as disclosed herein. Memory device configuration 800-*b* may include decoder 805-*b*, array of memory cells 810-*b*, and substrate 815-*b*, which may be examples of a decoder, array of memory cells, and substrate, as described in reference to FIGS. 2-7. In some cases, decoder 805-*b* may be positioned between array of memory cells 810-*b* and substrate 815-*b*.

Figure 9:
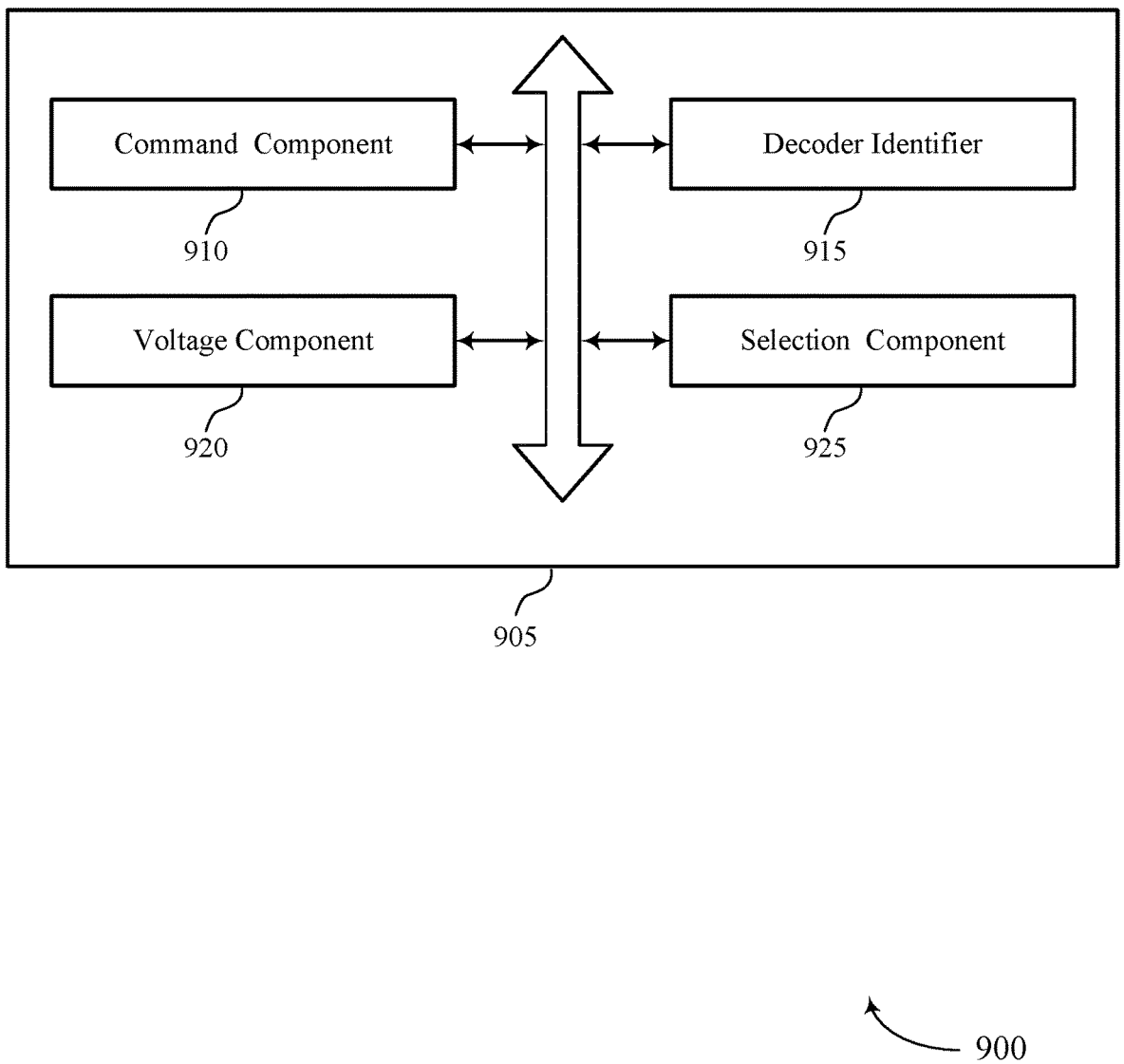
FIG. 9 shows a block diagram of a device that supports vertical decoders as disclosed herein.

FIG. 9 shows a block diagram 900 of a device 905 that supports vertical decoders as disclosed herein. In some examples, the device 905 may be an example of a memory array. The device 905 may be an example of portions of a memory controller (e.g., memory controller 140 as described with reference to FIG. 1). The device 905 may include command component 910, decoder identifier 915, voltage component 920, and selection component 925. Each of these components may communicate, directly or indirectly, with one another (e.g., via one or more buses).

Command component 910 may receive an access command comprising an instruction to perform an access operation on a memory cell. In some examples, command component 910 may issue a command for the first row decoder to apply the first access voltage to the access line coupled with the memory cell as part of the access operation of the memory cell based at least in part on identifying the first row decoder. In some examples, command component 910 may issue a command for the second row decoder to apply the second access voltage to the access line coupled with the memory cell as part of the access operation of the memory cell based at least in part on identifying the second row decoder.

Decoder identifier 915 may identify a first row decoder of a set of row decoders configured to apply a first access voltage to an access line coupled with the memory cell as part of the access operation based at least in part on receiving the access command. In some examples, decoder identifier 915 may identify a second row decoder of the set of row decoders configured to apply a second access voltage to the access line coupled with the memory cell as part of the access operation based at least in part on receiving the access command.

Voltage component 920 may apply, by the first row decoder, the first access voltage to the access line coupled with the memory cell as part of the access operation of the memory cell based at least in part on identifying the first row decoder. In some examples, voltage component 920 may apply, by the second row decoder, the second access voltage to the access line coupled with the memory cell as part of the access operation of the memory cell based at least in part on identifying the second row decoder. In some cases, applying the second access voltage to the access line may occur concurrently with applying the first access voltage to the access line. In some examples, voltage component 920 may delay an application of the first access voltage to the access line based at least in part on identifying the second row decoder for applying the second access voltage.

Selection component 925 may select the memory cell during the access operation based at least in part on applying the first access voltage to the access line.

Figure 10:
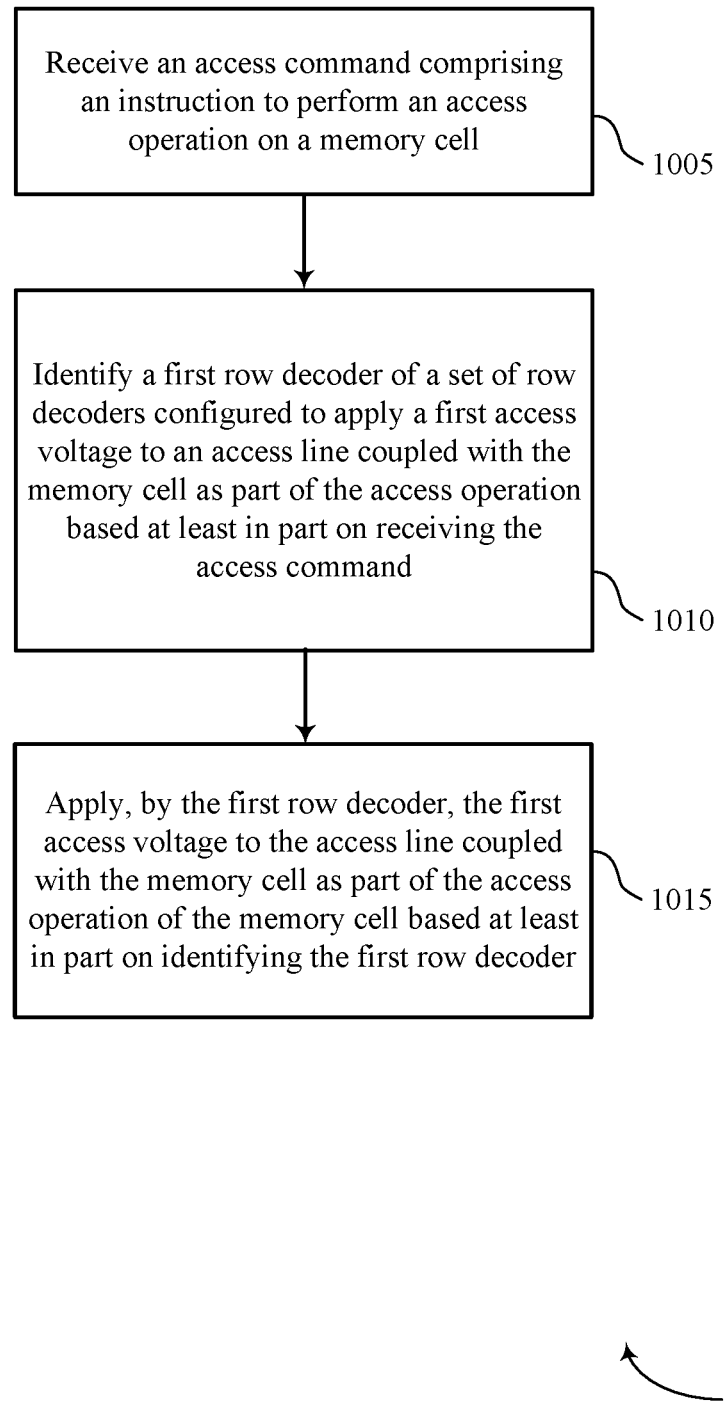
FIGS. 10 and 11 show flowcharts illustrating a method or methods that support vertical decoders as disclosed herein.

FIG. 10 shows a flowchart illustrating a method 1000 that supports vertical decoders as disclosed herein. The operations of method 1000 may be implemented by a memory controller or its components as described herein. For example, the operations of method 1000 may be performed by a device 905 as described with reference to FIG. 9 or a memory controller 140 as described with reference to FIG. 1. In some examples, a memory controller may execute a set of instructions to control the functional elements of the memory array to perform the functions described below. Additionally or alternatively, a memory controller may perform portions of the functions described below using special-purpose hardware.

At 1005, the memory controller may receive an access command comprising an instruction to perform an access operation on a memory cell. The operations of 1005 may be performed according to the methods described herein. In some examples, portions of the operations of 1005 may be performed by a command component as described with reference to FIG. 9.

At 1010, the memory controller may identify a first row decoder of a set of row decoders configured to apply a first access voltage to an access line coupled with the memory cell as part of the access operation based at least in part on receiving the access command. The operations of 1010 may be performed according to the methods described herein. In some examples, portions of the operations of 1010 may be performed by a decoder identifier as described with reference to FIG. 9.

At 1015, the memory controller may apply, by the first row decoder, the first access voltage to the access line coupled with the memory cell as part of the access operation of the memory cell based at least in part on identifying the first row decoder. The operations of 1015 may be performed according to the methods described herein. In some examples, portions of the operations of 1015 may be performed by a voltage component as described with reference to FIG. 9.

Figure 11:
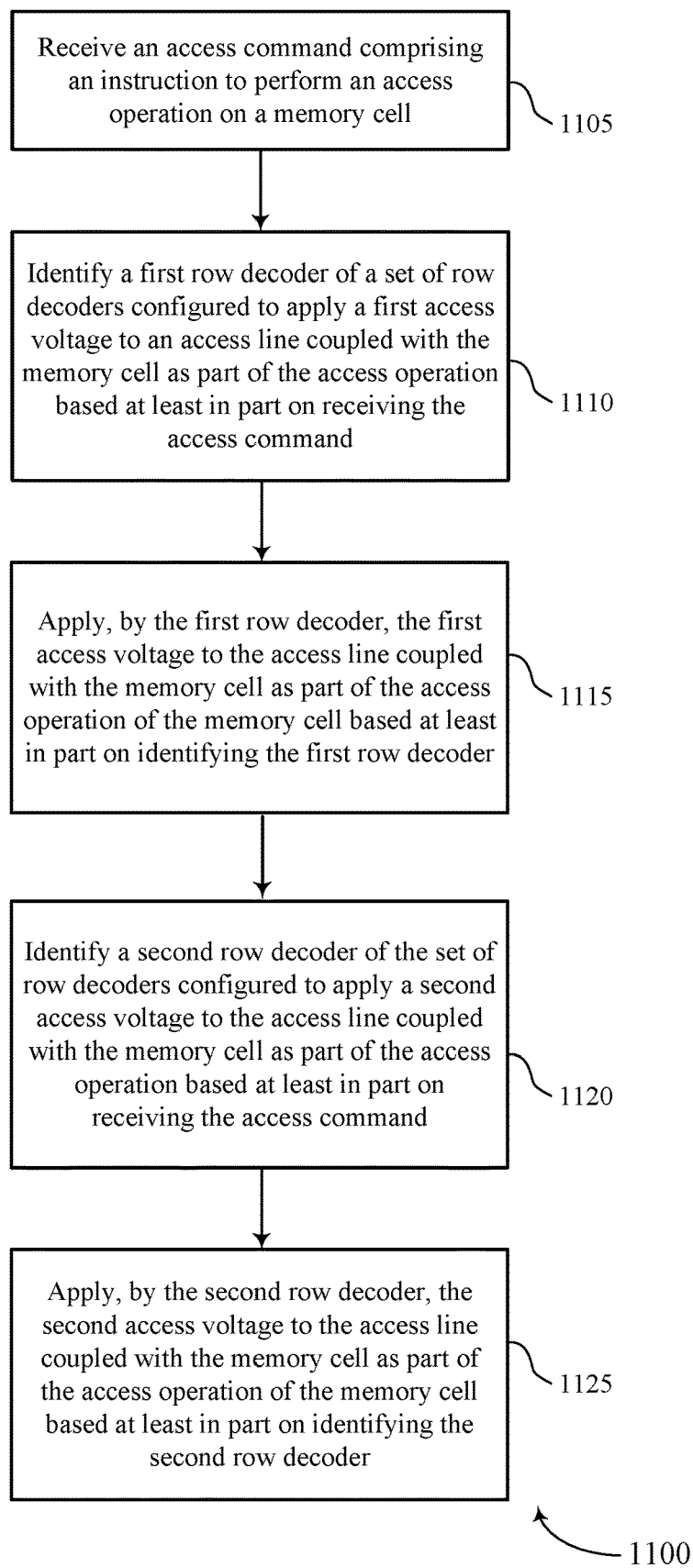

FIG. 11 shows a flowchart illustrating a method 1100 that vertical decoders as disclosed herein. The operations of method 1100 may be implemented by a memory controller or its components as described herein. For example, the operations of method 1100 may be performed by a device 905 as described with reference to FIG. 9 or a memory controller 140 as described with reference to FIG. 1. In some examples, a memory controller may execute a set of instructions to control the functional elements of the memory array to perform the functions described below. Additionally or alternatively, a memory controller may perform portions of the functions described below using special-purpose hardware.

At 1105, the memory controller may receive an access command comprising an instruction to perform an access operation on a memory cell. The operations of 1105 may be performed according to the methods described herein. In some examples, portions of the operations of 1105 may be performed by a command component as described with reference to FIG. 9.

At 1110, the memory controller may identify a first row decoder of a set of row decoders configured to apply a first access voltage to an access line coupled with the memory cell as part of the access operation based at least in part on receiving the access command. The operations of 1110 may be performed according to the methods described herein. In some examples, portions of the operations of 1110 may be performed by a decoder identifier as described with reference to FIG. 9.

At 1115, the memory controller may apply, by the first row decoder, the first access voltage to the access line coupled with the memory cell as part of the access operation of the memory cell based at least in part on identifying the first row decoder. The operations of 1115 may be performed according to the methods described herein. In some examples, portions of the operations of 1115 may be performed by a voltage component as described with reference to FIG. 9.

At 1120, the memory controller may identify a second row decoder of the set of row decoders configured to apply a second access voltage to the access line coupled with the memory cell as part of the access operation based at least in part on receiving the access command. The operations of 1120 may be performed according to the methods described herein. In some examples, portions of the operations of 1120 may be performed by a decoder identifier as described with reference to FIG. 9.

At 1125, the memory controller may apply, by the second row decoder, the second access voltage to the access line coupled with the memory cell as part of the access operation of the memory cell based at least in part on identifying the second row decoder. The operations of 1125 may be performed according to the methods described herein. In some examples, portions of the operations of 1125 may be performed by a voltage component as described with reference to FIG. 9.

In some examples, an apparatus as described herein may perform a method or methods, such as the method 1100. The apparatus may include features, means, or instructions (e.g., a non-transitory computer-readable medium storing instructions executable by a processor) for receiving an access command comprising an instruction to perform an access operation on a memory cell. The apparatus may include features, means, or instructions (e.g., a non-transitory computer-readable medium storing instructions executable by a processor) for identifying a first row decoder of a set of row decoders configured to apply a first access voltage to an access line coupled with the memory cell as part of the access operation based at least in part on receiving the access command. The apparatus may include features, means, or instructions (e.g., a non-transitory computer-readable medium storing instructions executable by a processor) for applying, by the first row decoder, the first access voltage to the access line coupled with the memory cell as part of the access operation of the memory cell based at least in part on identifying the first row decoder.

Some examples of the method 1100 and the apparatus described herein may further include operations, features, means, or instructions for identifying a second row decoder of the set of row decoders configured to apply a second access voltage to the access line coupled with the memory cell as part of the access operation based at least in part on receiving the access command. Some examples of the method 1100 and the apparatus described herein may further include operations, features, means, or instructions for applying, by the second row decoder, the second access voltage to the access line coupled with the memory cell as part of the access operation of the memory cell based at least in part on identifying the second row decoder. In some cases, applying the second access voltage to the access line may occur concurrently with applying the first access voltage to the access line.

Some examples of the method 1100 and the apparatus described herein may further include operations, features, means, or instructions for delaying an application of the first access voltage to the access line based at least in part on identifying the second row decoder for applying the second access voltage. Some examples of the method 1100 and the apparatus described herein may further include operations, features, means, or instructions for selecting the memory cell during the access operation based at least in part on applying the first access voltage to the access line. Some examples of the method 1100 and the apparatus described herein may further include operations, features, means, or instructions for issuing a command for the first row decoder to apply the first access voltage to the access line coupled with the memory cell as part of the access operation of the memory cell based at least in part on identifying the first row decoder. Some examples of the method 1100 and the apparatus described herein may further include operations, features, means, or instructions for issuing a command for the second row decoder to apply the second access voltage to the access line coupled with the memory cell as part of the access operation of the memory cell based at least in part on identifying the second row decoder.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 102.

The devices discussed herein, including memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
   a substrate;
   an array of memory cells coupled with the substrate and comprising a first set of access lines and a second set of access lines;
   a first row decoder coupled with the substrate and a first side of the array of memory cells, the first row decoder configured to apply a first voltage to a first access line of the first set as part of an access operation; and
   a second row decoder coupled with the substrate and a second side of the array of memory cells opposite the first side of the array of memory cells, the second row decoder configured to apply a second voltage to the first access line of the first set as part of the access operation.

2. The memory device of claim 1, further comprising:
a first column decoder coupled with the substrate and a third side of the array of memory cells, the first column decoder configured to apply a third voltage to a second access line of the second set as part of the access operation, the first column decoder comprising a doped material extending from the second set of access lines in a direction that is non-parallel to a surface of the substrate.

3. The memory device of claim 2, further comprising:
a second column decoder coupled with the substrate and a fourth side the array of memory cells opposite the third side of the array of memory cells, the second column decoder configured to apply a fourth voltage to the second access line of the second set as part of the access operation, the second column decoder comprising a doped material extending from the second set of access lines in the direction that is non-parallel to the surface of the substrate.

4. The memory device of claim 3, wherein the array of memory cells is positioned between the first column decoder and the second column decoder.

5. The memory device of claim 1, wherein the array of memory cells is positioned between the first row decoder and the second row decoder.

6. The memory device of claim 1, wherein:
the first row decoder comprises a doped material extending from the first set of access lines in a direction that is non-parallel to a surface of the substrate; and
the second row decoder comprises a doped material extending from the first set of access lines in the direction that is non-parallel to the surface of the substrate.

7. The memory device of claim 6, further comprising:
a first conductive line configured to carry the first voltage for the first access line as part of the access operation, wherein the doped material of the first row decoder is configured to selectively couple the first conductive line with the first access line; and
a second conductive line configured to carry the second voltage for the first access line as part of the access operation, wherein the doped material of the second row decoder is configured to selectively couple the second conductive line with the first access line.

8. The memory device of claim 7, further comprising:
a first contact extending between the doped material of the first row decoder and the first access line of the array of memory cells, wherein the doped material of the first row decoder selectively couples the first conductive line of the first row decoder with the first contact; and
a second contact extending between the doped material of the second row decoder and the first access line of the array of memory cells, wherein the doped material of the second row decoder selectively couples the second conductive line of the second row decoder with the second contact.

9. The memory device of claim 7, further comprising:
a first conductive material coupled with the doped material of the first row decoder and configured to carry a voltage for causing the doped material of the first row decoder to selectively couple the first conductive line of the first row decoder with the first access line of the array of memory cells; and
a second conductive material coupled with the doped material of the second row decoder and configured to carry a voltage for causing the doped material of the second row decoder to selectively couple the second conductive line of the second row decoder with the first access line of the array of memory cells.

10. The memory device of claim 1, wherein the doped material of the first row decoder and the second row decoder are polysilicon.

11. A memory device, comprising:
a substrate;
an array of memory cells coupled with the substrate and comprising a first set of access lines and a second set of access lines;
a first column decoder coupled with the substrate and a first side of the array of memory cells, the first column decoder configured to apply a first voltage to a first access line of the first set as part of an access operation, the first column decoder comprising a doped material extending from the first set of access lines in a direction perpendicular to a surface of the substrate; and
a second column decoder coupled with the substrate and a second side of the array of memory cells, the second column decoder configured to apply a second voltage to the first access line of the first set as part of the access operation, the second column decoder comprising a doped material extending from the first set of access lines in the direction perpendicular to the surface of the substrate.

12. The memory device of claim 11, further comprising:
a first row decoder coupled with the substrate and a third side of the array of memory cells, the first row decoder configured to apply a third voltage to a second access line of the second set as part of the access operation, the first row decoder comprising a doped material extending from the second set of access lines in the direction perpendicular to the surface of the substrate.

13. The memory device of claim 12, wherein the first row decoder is positioned between the substrate and the array of memory cells.

14. The memory device of claim 12, wherein the array of memory cells is positioned between the substrate and the first row decoder.

15. The memory device of claim 12, wherein:
the first row decoder is configured to access memory cells coupled with the second access line;
the first column decoder is configured to access memory cells coupled with the first access line; and
the second column decoder is configured to access the memory cells coupled with the first access line.

16. The memory device of claim 11, wherein the array of memory cells is positioned between the first column decoder and the second column decoder.

17. The memory device of claim 11, further comprising:
a first conductive line configured to carry the first voltage for the first access line as part of the access operation, wherein the doped material of the first column decoder is configured to selectively couple the first conductive line with the first access line; and
a second conductive line configured to carry the second voltage for the first access line as part of the access operation, wherein the doped material of the second column decoder is configured to selectively couple the second conductive line with the first access line.

18. The memory device of claim 17, further comprising:
a first contact extending between the doped material of the first column decoder and the first access line of the array of memory cells, wherein the doped material of the first column decoder selectively couples the first conductive line of the first column decoder with the first contact; and a second contact extending between the doped material of the second column decoder and the first access line of the array of memory cells, wherein the doped material of the second column decoder selectively couples the second conductive line of the second column decoder with the second contact.

19. The memory device of claim 17, further comprising:
a first conductive material coupled with the doped material of the first column decoder and configured to carry a voltage for causing the doped material of the first column decoder to selectively couple the first conductive line of the first column decoder with the first access line of the array of memory cells; and
a second conductive material coupled with the doped material of the second column decoder and configured to carry a voltage for causing the doped material of the second column decoder to selectively couple the second conductive line of the second column decoder with the first access line of the array of memory cells.

20. A method, comprising:
receiving an access command comprising an instruction to perform an access operation on a memory cell;
identifying a first row decoder of a set of row decoders configured to apply a first access voltage to an access line coupled with the memory cell as part of the access operation based at least in part on receiving the access command; and
applying, by the first row decoder, the first access voltage to the access line coupled with the memory cell as part of the access operation of the memory cell based at least in part on identifying the first row decoder;
identifying a second row decoder of the set of row decoders configured to apply a second access voltage to the access line coupled with the memory cell as part of the access operation based at least in part on receiving the access command; and
applying, by the second row decoder, the second access voltage to the access line coupled with the memory cell as part of the access operation of the memory cell based at least in part on identifying the second row decoder.

21. The method of claim 20, wherein applying the second access voltage to the access line occurs concurrently with applying the first access voltage to the access line.

22. The method of claim 20, further comprising:
delaying an application of the first access voltage to the access line based at least in part on identifying the second row decoder for applying the second access voltage.

23. An apparatus comprising:
a substrate;
a set of row decoders comprising a first row decoder and a second row decoder configured to apply an access voltage to an access line as part of an access operation of a memory cell, each row decoder comprising a doped material extending from the access line in a direction that is non-parallel to a surface of the substrate; and
a controller operable to:
receive an access command comprising an instruction to perform the access operation on the memory cell;
identify the first row decoder from the set of row decoders to apply a first access voltage to the access line coupled with the memory cell as part of the access operation based at least in part on receiving the access command; and
issue a command for the first row decoder to apply the first access voltage to the access line coupled with the memory cell as part of the access operation of the memory cell based at least in part on identifying the first row decoder.

24. The apparatus of claim 23, wherein the controller is further operable to:
identify the second row decoder of the set of row decoders configured to apply a second access voltage to the access line coupled with the memory cell as part of the access operation based at least in part on receiving the access command; and
issue a second command for the second row decoder to apply the second access voltage to the access line coupled with the memory cell as part of the access operation of the memory cell based at least in part on identifying the second row decoder.

* * * * *